United States Patent
Delport et al.

(10) Patent No.: US 12,234,542 B2
(45) Date of Patent: Feb. 25, 2025

(54) SPUTTER DESPOSITION SYSTEM

(71) Applicant: FOX BIOSYSTEMS NV, Diepenbeek (BE)

(72) Inventors: Filip Delport, Diepenbeek (BE); Hana Fejtova, Deinze (BE); Tomas Fejt, Prague (CZ); Rudolf Roskovsky, Prague (CZ)

(73) Assignee: FOX BIOSYSTEMS NV, Diepenbeek (BE)

( * ) Notice: Subject to any disclaimer, the term of this patent is extended or adjusted under 35 U.S.C. 154(b) by 28 days.

(21) Appl. No.: 18/016,969

(22) PCT Filed: Jul. 23, 2021

(86) PCT No.: PCT/EP2021/070734
§ 371 (c)(1),
(2) Date: Jan. 19, 2023

(87) PCT Pub. No.: WO2022/018282
PCT Pub. Date: Jan. 27, 2022

(65) Prior Publication Data
US 2023/0287558 A1 Sep. 14, 2023

(30) Foreign Application Priority Data
Jul. 24, 2020 (EP) .................... 20187737

(51) Int. Cl.
*C23C 14/34* (2006.01)
*C23C 14/50* (2006.01)

(52) U.S. Cl.
CPC ............ *C23C 14/34* (2013.01); *C23C 14/505* (2013.01)

(58) Field of Classification Search
CPC .................. C23C 14/505; H01J 37/32715
USPC .................. 118/730; 204/298.27, 298.15
See application file for complete search history.

(56) References Cited

U.S. PATENT DOCUMENTS

| | | |
|---|---|---|
| 2002/0062791 A1 | 5/2002 | Ginovker et al. |
| 2005/0126797 A1 | 6/2005 | Mikulec |
| 2010/0104749 A1 | 4/2010 | Zhao et al. |

FOREIGN PATENT DOCUMENTS

| | | | |
|---|---|---|---|
| CN | 103361616 B | 9/2015 | |
| CN | 110129753 A | 8/2019 | |
| CN | 111254397 | * 6/2020 | ........... C23C 14/022 |

(Continued)

OTHER PUBLICATIONS

Machine Translation CN 111254397 (Year: 2020).*

(Continued)

*Primary Examiner* — Rodney G McDonald
(74) *Attorney, Agent, or Firm* — Dinsmore & Shohl LLP (57) ABSTRACT

The present invention relates to a sputter deposition system that comprises a rotatable substrate holder for holding one or more substrates and configured to allow rotation of the one or more substrates around their own axis and around the rotation axis of the rotatable substrate holder. The present invention provides for the coating of one or more substrates at the top end of the said one or more substrates and provides a homogeneous deposition of the substrate or substrates. Further, hereby disclosed is a method for depositing a coating on one or more substrates by means of the sputter deposition system described herein.

14 Claims, 4 Drawing Sheets

(56) References Cited

FOREIGN PATENT DOCUMENTS

JP        H10219447 A    8/1998
WO    2007106732 A1    9/2007

OTHER PUBLICATIONS

International Search Report and Written Opinion mailed Oct. 26, 2021 in reference to European Application No. PCT/EP2021/070734 filed Jul. 29, 2021.

\* cited by examiner

SPUTTER DESPOSITION SYSTEM

CROSS REFERENCES TO RELATED APPLICATIONS

This application is a national-stage application under 35 U.S.C. § 371 of International Application No. PCT/EP2021/070734, filed Jul. 23, 2021, which International Application claims benefit of priority to European Patent Application No. 20187737.0, filed Jul. 24, 2020.

FIELD OF THE INVENTION

The present invention relates to a sputter deposition system that comprises a rotatable substrate holder for holding one or more substrates and configured to allow rotation of the one or more substrates around their own axis and around the rotation axis of the rotatable substrate holder. Also methods for homogenously depositing at least one film on one or more substrates are disclosed.

BACKGROUND TO THE INVENTION

Surface plasmon resonance (SPR) technology has emerged as the standard technology in several technological fields. Crucial in SPR technology is the use of homogeneously coated optical sensors or probes.

Optical sensors or fibers are often deposited with a large number of films. In order to be applicable in high-sensitive technologies such as SPR, deposition layers on optical sensors and fibers need to be very homogeneous otherwise the sensor signal will be of low quality and not very reproducible. Furthermore, in high-sensitive technologies such as surface plasmon resonance it is essential that sensors and fibers are homogeneously coated with a very thin layer. On the other hand, since in many high-sensitive technologies the sensors are 3D substrates, for example cylindrical substrates, homogeneous coating of said sensors is challenging.

Sputter deposition is a physical vapor deposition technique that allows for the coating of a substrate by means of sputtered ions, which are generated from a target. The ions are deposited on the substrate after being ejected from said target after bombardment with energetic particles of a plasma or gas. The ejected sputtered ions, which are typically only a small fraction of the ejected particles and are present as a plasma, reach the substrate and/or the inside of the sputter chamber and get deposited thereon.

Sputter deposition devices using one type of rotation, in particular rotation of the substrate around one axis, in particular around the axis of the substrate holder, have been described in the past, such as for example in WO020575014 and WO07106732. These devices allow positioning of several substrates in the sputter deposition device and thus enable depositing several substrates in one device. On the other hand, since rotation only occurs around one axis, there still remains a shadow part on the substrates which is exposed to a lesser extent to the sputtered atoms. Hence, a homogeneous coating of the substrates is impossible. Furthermore, these devices neither allow coating of the upper side of the substrates since this side is never exposed to the plasma/sputtered atoms.

If only one substrate is placed centrally in the sputter plasma and rotated the coating will be homogeneous and devoid of 'shadow' effects. If multiple substrates are loaded into the sputter chamber they will suffer either from an inhomogeneous plasma as the field strength differs throughout the vacuum chamber of the sputter device or a 'shadow' from another substrate is created blocking the sputtered atoms. So, to avoid shadows between more than one substrate and coat the substrate homogeneously in three dimensions the position of the substrate within the plasma can only be central and rotation. Nevertheless, it is not economic to coat only one substrate at a time.

At present, sputter deposition systems as used in SPR applications described in the state of the art only allow rotation of the substrate 1 around one axis, more specific around the axis of the rotatable substrate holder 2. This assures that the substrate 2 is rotated throughout the sputtering plasma, but only at fixed diameter. As a result, there is an asymmetric deposition of the particles.

Though, for some applications it is important to provide a homogeneous coating, such as for applications requiring an optimal SPR effect, a homogenous coating should be achieved since inhomogeneous coatings lead to an asymmetric resonance dip during SPR. Furthermore, only a limited amount of sensor probes can be coated in a single run as they can cause a shadow on the neighbouring sensor probes, thereby further increasing the inhomogeneous nature of the coating on these probes. To overcome these shortcomings and to be able to produce high quality, high throughput and low-cost sensor probes, a new concept was designed as disclosed herein.

Starting herefrom, it was the object of the present invention to provide a sputter deposition device which enables a stable deposition process of a 3D substrate and that ensures that the one or more films can be deposited in a homogeneous manner on the more than one 3D substrate, in particular on a cylindrical 3D substrate.

SUMMARY OF THE INVENTION

The present invention relates to a sputter deposition system for depositing at least one film on one or more substrates. Typical for the present invention is that the sputter deposition system of the present invention comprises a sputter chamber equipped with a rotatable substrate holder for holding one or more substrates, wherein the rotatable substrate holder is configured to hold the one or more substrates and to allow rotation of said one or more substrates around their own axis and around the rotation axis of the rotatable substrate holder, thereby providing a double rotation system. Since the substrates are rotated around these two axes, deposition of the one or more films on the substrates will occur in a homogenous manner resulting in an improved film deposition. Further, the present invention provides for a system wherein said one or more substrates are being held in position inside the rotatable substrate holder by means of a tilted friction clamping principle. In said system the substrates are held under a certain angle inside the rotatable substrate holder and will be better secured in the rotatable substrate holder when the rotatable substrate holder is rotated in one direction. Adversely, rotation of the rotatable substrate holder in the opposite direction facilitates the removal of the substrates from the rotatable substrate holder. Further, the present invention allows for a homogeneous movement for all substrates through a homogeneous location (the field density and directionality can change throughout the sputter zone) of the coating within the plasma. The present invention allows for a denser loading of the substrate onto the substrate holder within the space available in the sputtering chamber, and still avoids the formation of shadows, so that the coating of the substrates is homogeneous.

Further, the present invention has the advantage of ensuring that the substrate or substrates being coated are provided to remain at approximately the same height in the plasma which is another dimension to ensure a homogeneous coating, and it further provides also the coating of the top side of the substrate.

This achieved by the angle of the grooves and the rotational direction pushing the objects into the grooves which have a physical bottom.

The sputter deposition system of the present invention is thus characterized by the presence of a rotatable substrate holder. In a particular embodiment, the rotatable substrate holder comprises an outer ring and an inner ring, wherein the outer ring is configured to be fixed and wherein the inner ring is configured to rotate around the rotation axis of the rotatable substrate holder.

In a further embodiment, the outer ring and the inner ring form a bearing assembly, such as for example a cylindrical roller assembly or ball bearing assembly, that allows the inner ring to rotate around the rotation axis of the rotatable substrate holder, whereas the outer ring is being fixed. Further, in accordance with an embodiment of the present invention the bearing or bearings of said bearing assembly are said to be one or more substrates.

In another embodiment, the rotatable substrate holder may further comprise a stop system located on the outer ring.

In still another embodiment, the rotatable substrate holder further comprises a rubber layer present in between the outer ring and the inner ring. This rubber layer can be selected from a rubber ribbon or a rubber ring. In still another embodiment, the rubber layer is configured to be clamped around the outer ring.

The sputter deposition system of the present invention is configured to hold one or more substrates to allow said substrates to be deposited with at least one film. The substrates are typically cylindrical substrates. Even more, due to characteristics of the sputter deposition system and the double rotation of the substrates, the substrates can be homogenously be deposited with at least one film. Even more specifically, also the upper side of the substrate will be deposited.

The sputter deposition system of the present invention is further characterized in that the rotatable substrate holder is configured to receive the one or more substrates under an angle of between 0.1° and 15°. In a more preferred embodiment, the rotatable substrate holder is configured to receive the one or more substrates under an angle of between 0.5° and 5°.

In another aspect of the invention, the one or more substrates that are hold in the rotatable substrate holder are positioned with a distance of between 0.5 mm and 5.0 mm from each other.

In still another aspect of the present invention, the one or more substrates that are positioned in the rotatable substrate holder are optical fibers; in particular optical sensors.

In a further embodiment, the sputter chamber of the sputter deposition system of the present invention is a high vacuum chamber.

The present invention also discloses a method for homogeneously depositing at least one film on one or more substrates, such as optical fibers, using a deposition system according to any of the embodiments of the present invention.

In another aspect, a method for homogeneously depositing at least one film on one or more substrates is disclosed, said method comprising positioning one or more substrates in the rotatable substrate holder, said substrates being positioned around their own axis and around the rotation axis of the rotatable substrate holder, sputtering of a sputtering target source resulting in the ejection of sputter particles; in particular sputter particle atoms; introducing into the sputter chamber a reactive gas having reactive gas atoms that react with the sputter particles released from the sputter target source, thereby depositing a film on the substrate.

Said method is typically characterized in that during sputtering the one or more substrates are rotated around their own axis and around the rotation axis of the rotatable substrate holder.

In one aspect of said method, the one or more substrates are cylindrical substrates.

In a further aspect of said method, the one or more substrates are optical fibers; even more in particular optical sensors.

In another embodiment of said method, the one or more substrates are positioned in the rotatable substrate holder under an angle of between 0.1° and 15°; preferably under an angle of between 0.5° and 5°. In still another embodiment, the one or more substrates are positioned with a distance of between 0.5 mm and 5.0 mm from each other.

In still another embodiment of said method, the depositing occurs under high vacuum.

Therefore, the method for homogeneously depositing at least one film on one or more substrates of the present invention occurs in a high vacuum chamber, in particular in a high vacuum chamber of the sputter deposition system. In still another embodiment, said method is characterized in that sputtering occurs via direct current sputtering, pulsed DC sputtering, high power impulse magnetron sputtering (HIPIMS) or mid frequency AC sputtering.

In a further aspect, the present invention further relates to a coated substrate obtained with the method described herein, wherein at least one film is deposited on at least a part of the surface of the substrate. Further, in an embodiment according to the present invention, said film is homogeneously deposited on the substrate.

In yet a further aspect, the present invention relates to the use of a sputter deposition system as described in herein or a method as herein, in a coating process of one or more substrates.

BRIEF DESCRIPTION OF THE DRAWINGS

With specific reference now to the figures, it is stressed that the particulars shown are by way of example and for purposes of illustrative discussion of the different embodiments of the present invention only. They are presented in the cause of providing what is believed to be the most useful and readily description of the principles and conceptual aspects of the invention. In this regard, no attempt is made to show structural details of the invention in more detail than is necessary fora fundamental understanding of the invention. The description, taken with the drawings, makes apparent to those skilled in the art how the several forms of the invention may be embodied in practice.

FIG. 7, also abbreviated as FIG. 7, illustrates SPR data comparison for two batches of probes, a first batch (batch 1) of probes, not in accordance with the present invention, and obtained by means of a method and a systems in the state of the art, wherein the probes are coated while their they rotate around the axis of the substrate holder, but not around their own axis, i.e. a solid (static) probe holder is used (see dashed lines), and a second batch (batch 2) comprising probes according to the present invention, obtained by means of a sputter deposition system and method according to the present invention (see solid lines), whereas the probes are coated while they are rotated around both their own axis and the axis of the substrate holder. Probes according to the present invention (in batch 2) are characterized by a more homogeneous coverage of a sputtered material (in this case gold), which has influence on the SPR data obtained.

DETAILED DESCRIPTION OF THE INVENTION

The present invention will now be further described. In the following passages, different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

When describing the compounds of the invention, the terms used are to be construed in accordance with the following definitions, unless a context dictates otherwise.

The term "about" or "approximately" as used herein when referring to a measurable value such as a parameter, an amount, a temporal duration, and the like, is meant to encompass variations of +/−10% or less, preferably +/−5% or less, more preferably +/−1% or less, and still more preferably +/−0.1% or less of and from the specified value, insofar such variations are appropriate to perform in the disclosed invention. It is to be understood that the value to which the modifier "about" or "approximately" refers is itself also specifically, and preferably, disclosed.

As used in the specification and the appended claims, the singular forms "a", "an", and "the" include plural referents unless the context clearly dictates otherwise. By way of example, "a substrate" means one substrate or more than one substrate.

The present invention is directed to a sputter deposition system and a method for depositing at least one film on one or more substrates (1), such as optical fibers like optical sensors. Typical for the invention is that the substrates (1) are undergoing a double rotation during sputtering which ensures a homogeneous application of the coating or film on the complete surface of substrates (1). More specifically, the substrates (1) can rotate not only around the axis of the rotatable substrate holder (2), but also around their own axis. As this requires moving tools within the sputter chamber while fixing the vertical position of the sensor probes, a special rotatable substrate holder (2) was designed.

In the context of the present invention, by means of the term "homogeneous application" or "homogeneous coating", reference is made to the presence of a layer covering the substrate in a homogeneous way in the sense of thickness and/or roughness of the layer.

In the context of the present invention, by means of the term "film" or "coating", reference is made to a thin layer of a composition or substance.

In the context of the present invention, by means of the term "substrate", reference is made to an object having a surface which can be sputtered. In the context of the present invention, a possible substrate is a fiber, such as an optical fiber, such as an optical sensor.

In the context of the present invention, by means of the term "sputter chamber", reference is made to a delimited space wherein sputter deposition can take place. In the context of the present invention, the sputter chamber can be for example a vacuum chamber.

The sputter deposition system of the present invention thus comprises a sputter chamber equipped with a rotatable substrate holder (2) for holding the one or more substrates (1), such as fibers, or more specifically sensor probes, wherein the rotatable substrate holder (2) is configured to hold the one or more substrates (1) and to allow rotation of the one or more substrates (1) around their own axis and around the rotation axis of the rotatable substrate holder (2). By means of the sputter deposition system according to the present invention, a film can be deposited onto said one or more substrates thereby forming one or more coated substrates.

In the context of the present invention, by means of the term "rotatable substrate holder", reference is made to a component of the sputter deposition system holding a substrate (1) for deposition adapted to rotate and provide a double rotation to the one or more substrates (1).

The present invention provides for a double rotation system wherein the rotatable substrate holder (2) and the one or more substrates (1) held are adapted to rotate around the rotation axis of the rotatable substrate holder (2), wherein said one or more substrates (1) are further adapted to rotate around their own rotation axis; hence, a double rotation system for the one or more substrates (1) is provided.

Because of the double rotation system, not only a homogeneous coating is created but this system also ensures that the upper side of the sensors, which represents the reflection side, is coated.

The rotatable substrate holder (2) is thus configured to hold onto one or more substrates (1). For example, the rotatable substrate holder (2) may contain one or more holes, openings or grooves into which the substrates (1) can be positioned.

Typical for the present invention is thus the double rotation of the substrates (1). In one embodiment, the rotatable substrate holder (2) therefore comprises an outer ring (3) and an inner ring (4), wherein the outer ring (3) is configured to be fixed in position during operation and whilst the inner ring (4) is configured to rotate around the rotation axis of the rotatable substrate holder (2). The outer ring (3) is for example a block structure having a circular opening. The one or more substrates (1) are then provided to be positioned between said outer ring (3) and said inner ring (4) of the rotatable substrate holder (2), more specific into one or more openings present in the inner rotatable ring of the rotatable substrate holder (2). In accordance with the present embodiment, the double rotation of the substrates can also be achieved by rotating the outer ring (3) and keeping the inner ring (4) fixed, nevertheless, this is not preferred. Further, it would be clear to the skilled in the art that in order to provide double rotation of the substrates, either the inner ring (4) or the outer ring (3) should be provided to rotate relative to each other. In particular, double rotation of the substrates could also be achieved by rotating both the inner ring (4) and the outer ring (3), wherein either one of the inner ring (4) or the outer ring (3) rotates faster, or even backwards, than the other ring. In other words, it is not required for one of the two rings, either the inner ring (4) or the outer ring (3), to be fixed in position in order to provide for double rotation of the substrates, but it is nevertheless preferred. It is therefore preferred that at least one of the inner ring or outer ring has a fixed position (i.e. doesn't rotate), due to the ease of use of the obtained device and the lower manufacturing complexity.

In accordance with the present invention, the rotatable substrate holder (2) can comprise further rings placed in between the outer ring (3) and the inner ring (4). In between the outer ring (3) and the inner ring (4), further rings and further series of substrates (1) could be hold to increase the capacity to hold substrates (1) within one rotatable substrate holder (2) at different distances from the rotation axis, nevertheless, in order to avoid shadow formation and non-homogeneous coating, the substrates (1) have to be accurately distributed and spaced from each other.

The outer ring (3) of the rotatable substrate holder (2) may further also comprise a stop system (5).

The stop system (5) can be a pin or pole protruding from the rotatable substrate holder (2) and being connected to the outer ring (3). Due to the friction created between the outer ring (3), the inner ring (4) and the substrates (1), the outer ring (3) should be kept in a still position and thus preventing it to rotate with the inner ring (4). In this way, in operation, the substrates (1) can steadily rotate around their own axis. The stop system (5) ensures the outer ring (3) to be fixated. Whilst the rotation takes place, the stop system (5) is adapted to be halted, therefore not allowing rotation of the outer ring (3) with the rest of the rotatable substrate holder (2). In order to hold the stop system (5), a vertical pole present inside the sputter chamber onto a rotative table or elsewhere and fixed in place can for example be used, which collides with said stop system (5), halting it.

Yet, in another embodiment, the rotatable substrate holder (2) in all its possible embodiments of the present sputter deposition system may comprise a rubber layer present in between the outer ring (3) and the inner ring (4).

In the context of the present invention, by means of the term "rubber layer", reference is made to a layer made of a material having rubber-like properties. This rubber layer can be selected from a rubber ribbon, in other words a rubber string, or a rubber ring. In still another embodiment, the rubber layer is configured to be clamped around the substrates (1) e.g. cylindrical substrates and the inner ring (4).

During rotation of the rotatable substrate holder (2), this rubber layer can be clamped thereby optimizing the friction and hence rotation between outer ring (3) and the substrate (1). The rubber layer enhances the friction caused by the outer ring (3) onto the substrate (1), the inner ring (4) rotates around its own axis and provides sliding of the substrate (1) therefore causing the rotation of the substrate (2) around its own axis while being dragged along by the inner ring (4).

In accordance with an embodiment of the present invention, the rubber layer can be a rubber ribbon, or string, tensioned for example in between screws at each end of the rubber ribbon, or string, while running around the inner ring (4) or the outer ring (3), preferably the inner ring (4). The rubber layer can be located inside a recess (7) either in the outer ring (3) or the inner ring (4), preferably the outer ring (3), and exposed to the interface between the outer ring (3) and the inner ring (4).

In accordance with an embodiment of the present invention, the rubber layer is present in between the outer ring (3) and the inner ring (4), and exposed to the interface between the outer ring (3) and the inner ring (4), and it is attached to the outer ring (3), and it is further adapted to contact the one or more substrates (1).

In a further aspect, the rubber material should be selected from a vacuum compatible and/or temperature stable materials, preferably, the rubber material is characterized by providing low leakage of gas from the material, or low permittivity of gasses, or low porosity in order to ensure that the sputter chamber can be vacuum pumped without contamination happening.

In a further aspect, the rotatable substrate holder (2) of the sputter deposition system of the present sputter deposition system is configured to receive the one or more substrates (1) under an angle of between 0.1° to 15°, preferably between 0.5° and 5°. By positioning the substrates (1) not completely vertical but under a certain angle, the substrates (1) will be pulled inwards in the rotatable substrate holder (2) when the rotatable substrate holder (2) is rotated in one direction. Adversely, rotation of the rotatable substrate holder (2) in the opposite direction facilitates the removal of the substrates (1) from the rotatable substrate holder (2). Further, in accordance with the present embodiment, one or more substrates (1) stay at the same height in the plasma which is another dimension to ensure a homogeneous coating. The present embodiment also allows for the top side of the substrate (1) to be coated.

The one or more substrates (1) are positioned in the rotatable substrate holder (2). For optimal and homogeneous application of the film, the substrates (1) are positioned with a distance of between 0.5 mm and 5 mm from each other.

Figure 4:
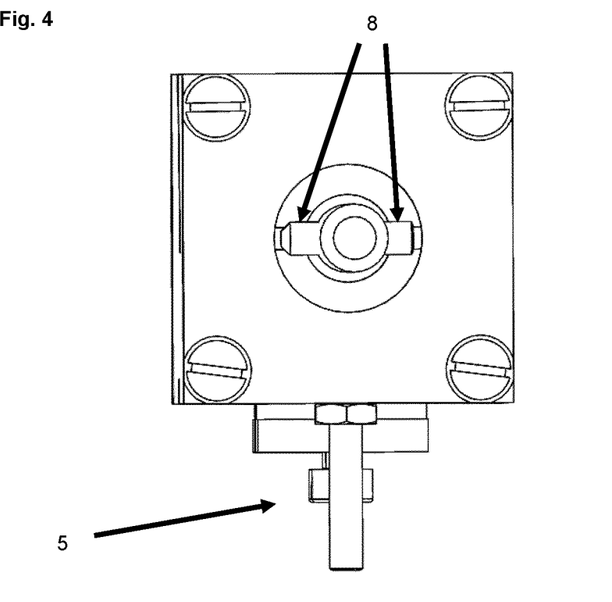
FIG. 4, also abbreviated as FIG. 4, illustrates a bottom view of the same substrate holder illustrated in the previous figures.

The sputter deposition system of the present invention further comprises a rotor which facilitates rotation of the rotatable substrate holder (2). The rotational movement of the rotor can be transferred as rotation of the rotatable support holder (2) directly, by engaging the rotor with one or more parts of the rotatable substrate holder (2), or by means of a rotative table transferring the rotation movement from the rotor to the rotatable substrate holder (2). For example, as illustrated in FIG. 4, the rotation can be transferred by means of two engaging protrusions (8) perpendicular to the second extremity of the rotatable substrate holder (2).

In accordance with an embodiment of the present invention, the sputter deposition system further comprises a rotative table onto which the rotatable substrate holder (2) can be positioned onto and which is provided to engage with one or more parts of the rotatable substrate holder (2), and is adapted to transfer the rotational movement of an external rotor to said one or more rotating parts of said rotatable substrate holder (2).

The present invention thus provides a sputter deposition system for depositing at least one film on one or more substrates (1) such as optical fibers. Sputter deposition is a physical vapor deposition method wherein a thin film of microscopic particles of a solid material are deposited by sputtering onto a substrate (1), after being ejected from a target, which target is itself bombarded by energetic particles of a plasma or gas. Sputtered atoms ejected from the target have a wide energy distribution, typically up to tens of eV. The sputtered ions, which are typically only a small fraction of the ejected particles and are present as a plasma, reach the substrate (1) hold in place by the rotatable substrate holder (2) and get deposited thereon, thereby forming a film or coating onto said substrate. The entire range from high-energy ballistic impact to low-energy thermalized motion is accessible by changing the background gas pressure in the sputter chamber. The plasma exposed to the substrate (1) is made of a gas being collided into itself by electrical and magnetizing forces creating a continuous ion cloud. The gas is therefore the raw material of the plasma existing in a different state (like solid, liquid, . . . ). The gas pressure or concentration creates therefore different conditions of plasma also depending on even the sputter chamber. This changes the sputter ion movement and density within that chamber.

The sputter deposition system of the present invention thus comprises a sputter chamber. Said sputter chamber is preferably a vacuum chamber, even more in particular a high vacuum chamber. The sputter chamber and in particular the vacuum chamber may further be adapted to maintain a controlled environment, e.g. temperature, pressure, and vacuum. In a further embodiment, the sputter deposition system comprises means to generate the vacuum in the sputter chamber.

To achieve the sputtering process an electrical field is created between a cathode target source and an anode in the vacuum chamber. Thus, in one aspect, the sputter deposition system comprises an anode in the sputter chamber. In another aspect, the sputter deposition system of the present invention further comprises a sputter target source. This sputter target source can be selected from WTi10, Au, NiV7, Ni, Ti, Cu, Cr, Al, Al alloys, Ni alloys, Pt, PZT (lead zirconate titanate), Ta, $SiO_2$, $Al_2O_3$, Zn, Ta, or GexSbYTez. In a preferred embodiment, the sputter target source is Au (gold).

During sputtering, a gas, typically an inert gas such as Argon, is introduced into the sputter chamber or vacuum chamber. Thus, the sputter deposition system may further comprise means for introducing a reactive gas in the sputter chamber; in particular means for introducing Argon into the sputter chamber. After introduction of the gas, electrons in the electrical field are accelerated and they gain enough energy to ionize the gas atoms, preferably the argon atoms, and to create a glow discharge plasma. The resulting plasma is then attracted to the target source, bombarding it and liberating the target surface atoms, such as for example gold atoms, that are subsequently evenly deposited on the outer surface of the substrate (1). Because of the double rotation of the substrates (1) in the present invention, deposition of the atoms occurs in an evenly distributed and homogeneous manner on the substrate (1).

The charged plasma is maintained in a relatively narrowly defined area in front of the target source by for example a magnetic field. The target source thus functions as the cathode in the sputtering system and a separate anode is provided in the chamber at a location spaced away from the target. Commonly, the chamber walls, a separate bar or another conductive member positioned away from the target source functions as the anode. Thus, the strong electric and magnetic fields confine charged plasma particles close to the surface of the sputter target source.

The present invention provides a sputter deposition system and a method for homogeneously depositing a film or coating onto one or more substrates (1). In one aspect, said substrates (1) are selected from a silicon wafer, an optical sensor, an optical fiber.

In another preferred embodiments, said substrates (1) are cylindrical substrates (1), such as optical sensors or optical fibers. In a further aspect, the substrates (1) are optical sensors, preferably optical fibers.

The present invention further discloses a rotatable substrate holder (2) as disclosed herein above. Said rotatable substrate holder (2) is configured to hold one or more substrates (1) to be coated inside a sputter deposition system. Typical for the rotatable substrate holder (2) is that it allows rotation of the one or more substrates (1) around their own axis and around the rotation axis of the rotatable substrate holder (2).

In a further embodiment, the rotatable substrate holder (2) comprises an outer ring (3) and an inner ring (4), wherein the outer ring (3) is configured to be fixed and wherein the inner ring (4) is configured to rotate around the rotation axis of the rotatable substrate holder (2). The one or more substrates (1) can then be positioned on the inner rotatable ring of the rotatable substrate holder (2), more specific into one or more openings present in the inner rotatable ring of the rotatable substrate holder (2).

In accordance with an embodiment of the present invention, the outer ring (3) and the inner ring (4) are part of a bearing assembly which can comprise one or more bearings, such as roller bearings or ball bearings, interposed between the inner ring (4) and the outer ring (3). Further, in a preferred embodiment of the present invention, said bearing or bearings of said bearing assembly are the one or more substrates (1). In other words, the one or more substrates (1) are provided to rotate around their own axis in between the inner ring (4) and the outer ring and thereby function as bearings. In a further embodiment, in between the inner ring (4) and outer ring (3), only the substrate or substrates (1) are adapted to rotate.

In the context of the present invention, by means of the term "outer ring", reference is made to a ring-shape at a greater distance from a center. The outer ring (3) can also be a block structure with a ring opening in the center. In the context of the present invention, by means of the term "inner ring", reference is made to a ring-shape at a smaller distance from a center. By means of the term ring-shape, reference is made to a shape which comprises at least one cylindrical surface.

Yet, in another embodiment, the rotatable substrate holder (2) in all its possible embodiments may comprise a rubber layer present in between the outer ring (3) and the inner ring (4). The rubber layer is preferably present in a recess (7) located in the outer ring (3). During rotation of the rotatable substrate holder (2) when positioned in a sputter deposition system as described herein above, this rubber ring can be clamped or tightened thereby optimizing the friction between each of the rings, meaning the outer ring (3) and the inner ring (4), and the substrate (1), and hence optimizing the relative rotation between the substrate (1) and the inner ring (4).

The rotatable substrate holder (2) of the present invention is thus configured to hold one or more substrates (1) in one or more openings or grooves. Preferably, said openings and grooves are located in the inner ring (4) of the rotatable substrate holder (2). In a further aspect, the one or more substrates (1) are positioned under an angle of between 0.1 to 15°, preferably between 0.5° and 5°. By positioning the substrates (1) not completely vertical but under a certain angle inside the rotatable substrate holder (2), the substrates (1) will be better secured in the rotatable substrate holder (2) when the rotatable substrate holder (2) is rotated in one direction. Adversely, rotation of the rotatable substrate holder (2) in the opposite direction facilitates the removal of the substrates (1) from the rotatable substrate holder (2), therefore exposing the top side to allow controlled relative coating of the side and the top of the substrate (1), e.g. an optical fiber, and maintaining the height of the substrate or substrates (1) in between the rotatable substrate holder (2) and the ceiling of the sputter chamber so to create more homogeneous coating conditions as these will differ due to distance of the substrate (1) from the sputter target.

In a further embodiment of the rotatable substrate holder (2) as disclosed herein, the openings or grooves are located with a distance of between 0.5 mm and 5 mm from each other. As a result, the substrates (1) can be positioned with a distance of between 0.5 mm and 5 mm from each other in the rotatable substrate holder (2).

In still another embodiment, rotatable substrate holder (2) is part of a sputter deposition system according to any of the embodiments as described herein above.

In still another aspect of the invention, a method for homogeneously depositing at least one film on one or more substrates (1) is disclosed, said method using a sputter deposition system or a rotatable substrate holder (2) according to any of the embodiments described herein above.

In another aspect, a method for homogeneously depositing at least one film on one or more substrates (1) is disclosed. Said method comprises: positioning one or more substrates (1) on a rotatable substrate holder (2) that is configured to allow rotation of the one or more substrates (1) around their own axis and around the rotation axis of the rotatable substrate holder (2); positioning the rotatable substrate holder (2) comprising the one or more substrates (1) in the sputter chamber of a sputter deposition system comprising a sputtering target source; sputtering of the sputtering target source resulting in the ejection of sputter particles; in particular sputter particle atoms; introducing into the sputter chamber a reactive gas having reactive gas atoms that react with the sputter particles released from the sputter target source, thereby depositing a film on the one or more substrates (1). This method is typically characterized in that during sputtering the one or more substrates (1) are rotated around their own axis and around the rotation axis of the rotatable substrate holder (2).

In a further embodiment of said method, sputtering occurs via direct current sputtering, pulsed DC sputtering, high power magnetron sputtering, mid frequency AC sputtering or RF sputtering.

In still another embodiment, the method is further characterized in that the one or more substrates (1) are positioned in the rotatable substrate holder (2) under an angle of between 0.1° and 15°, preferably between 0.5° and 5°. By positioning the substrates (1) not completely vertical but under a certain angle, the substrates (1) will be better secured in the rotatable substrate holder (2) when the rotatable substrate holder (2) is rotated in one direction. Adversely, rotation of the rotatable substrate holder (2) in the opposite direction facilitates the removal of the substrates (1) from the rotatable substrate holder (2).

In a further embodiment of said method, the rotatable substrate holder (2) is a rotatable substrate holder (2) according to any of the described embodiments herein disclosed.

In still another further embodiment of said method, the sputter depositing system is a sputter depositing system according to any of the embodiment describes herein above.

In said method, the substrates (1) are preferably cylindrical substrates (1). In another embodiment, the substrates (1) are optical sensors, or sensor probes, preferably optical fibers.

Figure 1:
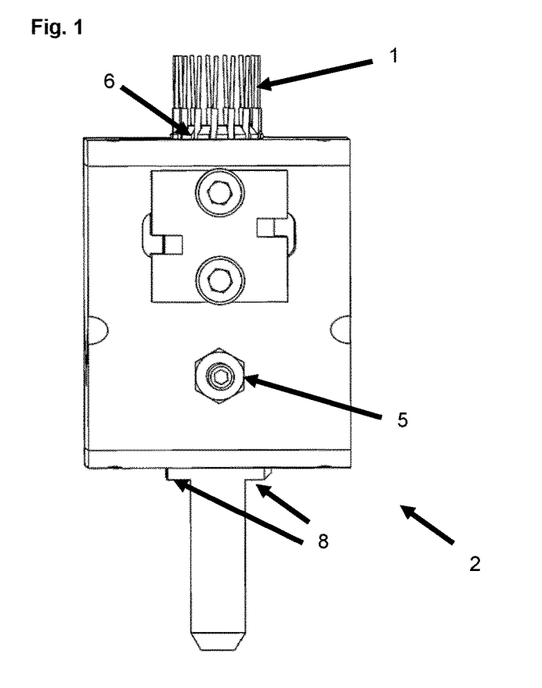
FIG. 1, also abbreviated as FIG. 1, illustrates a technical drawing depicting a frontal view of a substrate holder in accordance with the present invention, which is capable of holding sputter for coating up to 15 substrates or probes.

As previously explained, the present invention pertains to a sputter deposition system for depositing at least one film on one or more substrates (1), said system comprising a sputter chamber equipped with a rotatable substrate holder (2) for holding the one or more substrates (1), wherein the rotatable substrate holder (2) is configured to hold the one or more substrates (1) and to allow rotation of the one or more substrates (1) around their own axis and around the rotation axis of the rotatable substrate holder (2). FIG. 1 illustrates an implementation of a rotatable substrate holder (2) in accordance with the present invention. More specifically, FIG. 1, illustrates a technical drawing depicting a frontal view of a rotatable substrate holder (2) in accordance with the present invention. At the top of FIG. 1, a plurality of substrates (1) to be coated is visible at a holder (2) first extremity. Said plurality of substrates (1) is also visible in FIG. 2, which is a lateral view of the same rotatable substrate holder (2) depicted in FIG. 1. The plurality of substrates (1) is in the present realization of the invention a series of fibers protruding from said first extremity of the rotatable substrate holder (2). The fibers are arranged around an inner ring (4), not shown in the present figure, which is adapted to rotate.

The rotatable substrate holder (2) illustrated in the figures is a rotatable substrate holder (2) comprising an outer ring (3) and an inner ring (4), wherein the outer ring (3) is configured to be fixed and wherein the inner ring (4) is configured to rotate around the rotation axis of the rotatable substrate holder (2). It would be evident from the figures that in the present implementation of the invention the outer ring (3) takes the shape of the external part of the rotatable substrate holder (2), in the present case a rectangular parallelepiped, whilst the inner ring (4) takes the shape of a cylinder in FIGS. 1 to 5, or an hollow cylinder, or tube, in FIGS. 6A and 6B.

In accordance with an embodiment of the present invention, the outer ring (3) is configured to be fixed by means of a stop system (5), visible in FIGS. 1 to 5, which allows for the outer ring (3) to maintain its position and not rotate with the outer ring (3). With the outer ring (3) capable of maintaining a fixed position during operation, and with the inner ring (4) rotating, the fibers are allowed to rotate around both their own axis and around the rotation axis of the rotatable substrate holder (2).

Figure 2:
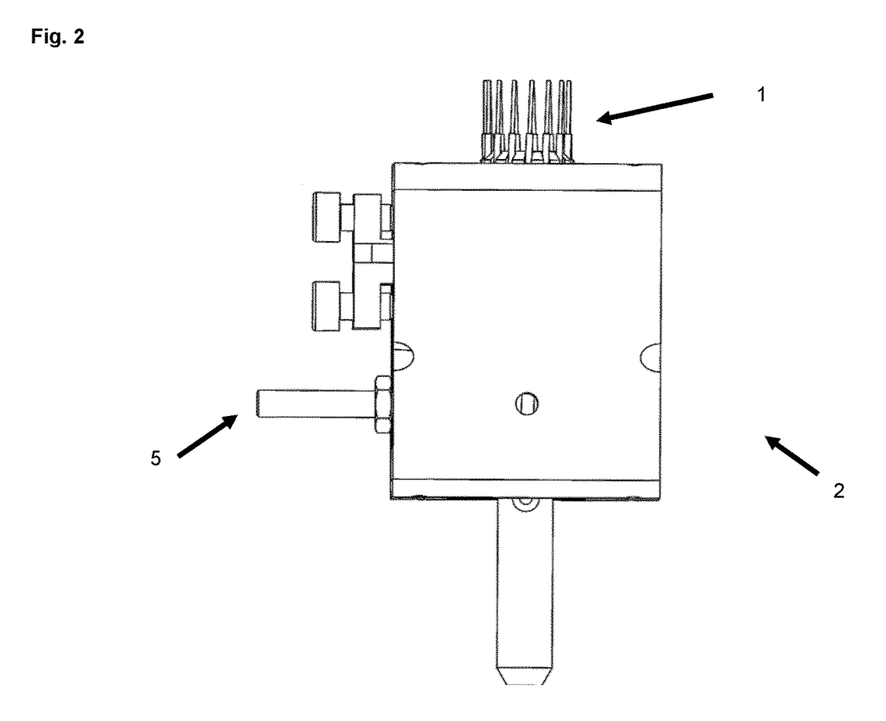
FIG. 2, also abbreviated as FIG. 2, illustrates a later view of the substrate holder introduced in FIG. 1.
Figure 5:
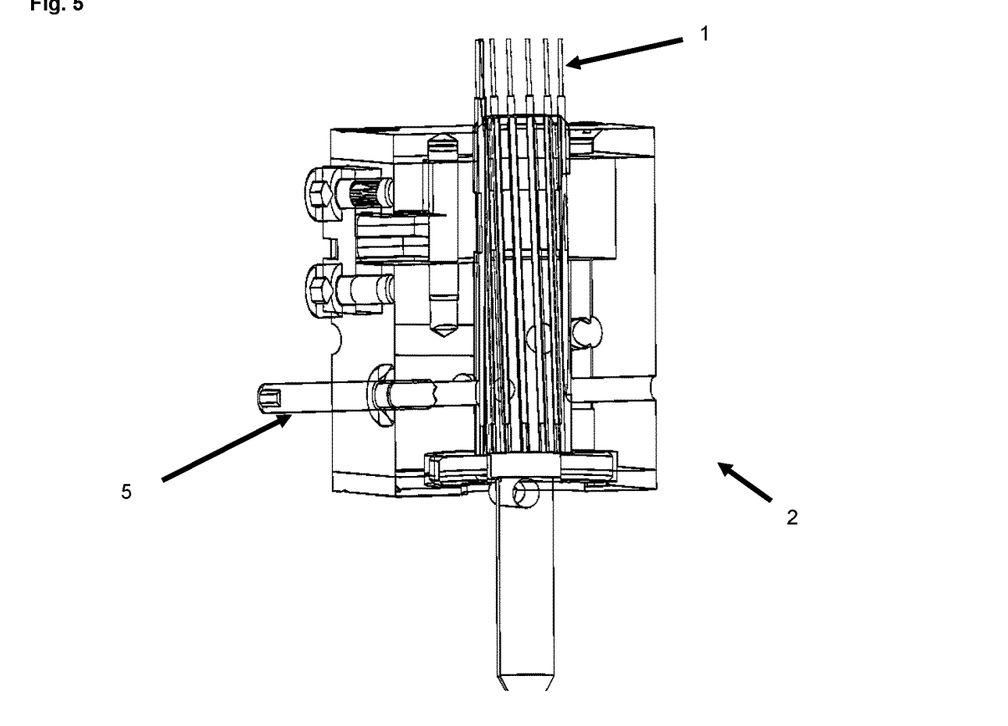
FIG. 5, also abbreviated as FIG. 5, illustrates a cross section of the substrate holder illustrated by FIGS. 1 to 4.

In order to provide rotation of said inner ring (4), the inner ring (4) is connected with an holder (2) second extremity, visible at the bottom of the FIGS. 1, 2 and 5, provided with two engaging protrusions (8), clearly visible in the bottom view in FIG. 4, which are adapted to engage with two grooves located into a rotative table (not shown) which transfer rotational movement to said second holder (2) extremity causing rotation of the inner ring (4). Further, illustrated in FIG. 1 are slots (6) visible at the first extremity of the rotatable substrate holder (2), that allow the fibers to maintain a specific distance among each other.

Figure 3:
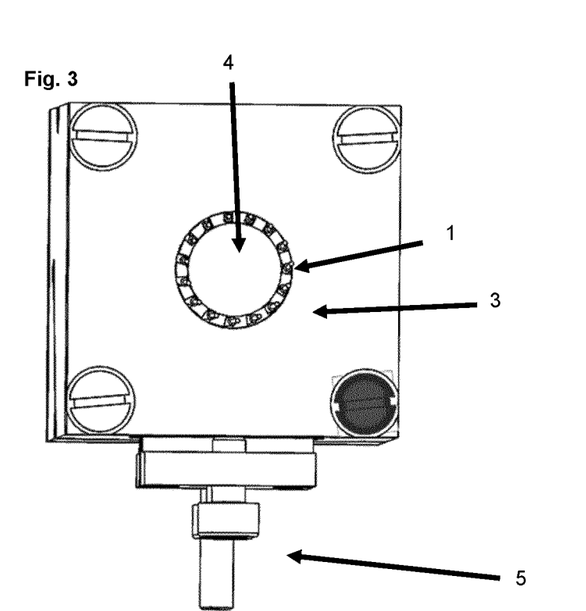
FIG. 3, also abbreviated as FIG. 3, illustrates a top view of the same substrate holder illustrated in the previous figures.

The entire rotatable substrate holder (2) is to be positioned inside a vacuum chamber containing plasma during operation, which plasma is provided to come into contact with the part of the fibers at said first extremity exposed to said plasma, and hold by the rotatable substrate holder (2). FIG. 3 illustrates a top view of the same rotatable substrate holder (2) illustrated in FIGS. 1, 2 and 4. The rotation of the fibers by means of the rotatable substrate holder (2) and the rotative table provides for a homogeneous exposure of the fibers to the plasma, and therefore a homogeneous coating.

Figures 6A, 6B:
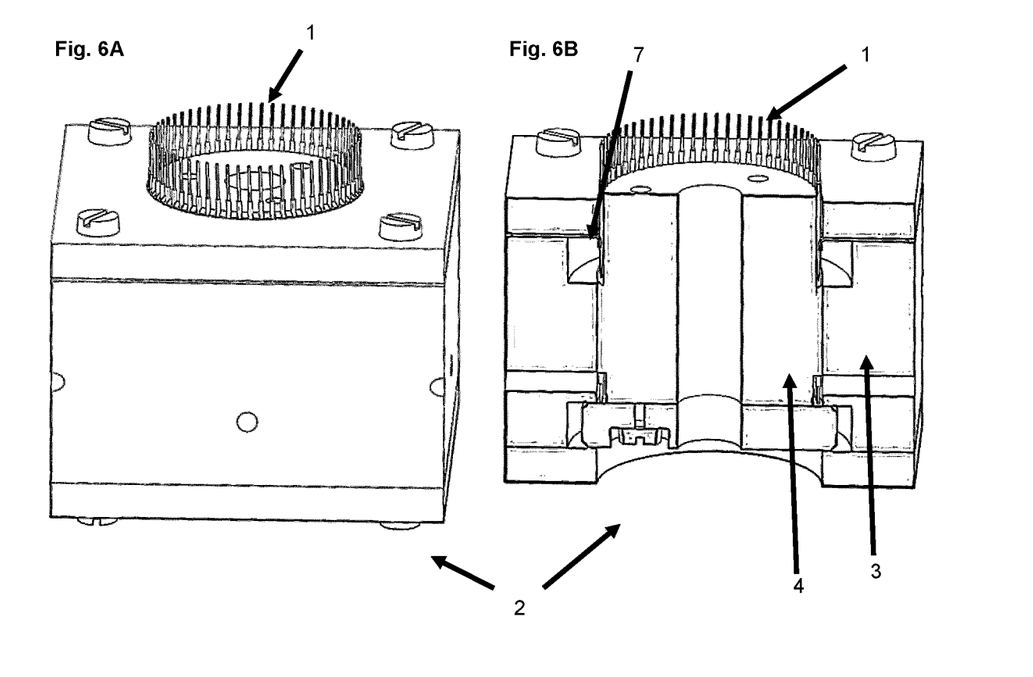
FIG. 6A, also abbreviated as FIG. 6A, illustrates a substrate holder in accordance with the present invention, which is provided to hold up to 60 substrates or probes.
FIG. 6B, also abbreviated as FIG. 6B, illustrates a cross-section of the substrate holder illustrated in FIG. 6A.

FIG. 6A illustrates a rotatable substrate holder (2) in accordance with the present invention, which is provided to hold up to 60 fibers, or probes. FIG. 6B illustrates a cross-section of the rotatable substrate holder (2) illustrated in FIG. 6A. FIG. 6B clearly show the presence of an outer ring (3) and an inner ring (4), between which fibers are hold. Also shown in FIG. 6B is the recess (7) to receive the rubber layer in between the inner and outer ring (3).

In a further aspect, the present invention further relates to a coated substrate obtained with the method described herein, wherein at least one film is deposited on at least a part of the surface of the substrate.

Coated substrates in accordance with the present invention can be used for surface plasmon resonance (SPR) applications and comprise a surface coated with at least one thin film. It has been found that reflection of white light in the gold coated substrate (i.e. optical fiber) provides a lower average intensity difference Id between 500 nm and 750 nm compared to the state of the art. The intensity difference Id is the intensity of the light reflected from an interface (both normal reflection and SPR modified reflected light) with said film at 750 nm minus the intensity at 500 nm. The intensity difference Id measured in water is of less than 0.08, preferably less than 0.07, more preferably less than 0.065. Furthermore, the depth of the SPR dip measured in water is more than 29.5% in 84% of the sensor probes created with the new method compared to the less then 29.5% in 84% of the probes created by the state of the art. It is believed that the present effect is provided by the homogeneous coating of the substrates, which is obtained by means of the method and sputter deposition system of the present invention. An advantage of providing lower average intensity difference Id is that the obtained SPR signals which are tracked over time are more stable (homogeneous signal drift and less susceptible to changes in light intensities from the light source). Furthermore, an even gold coating means a more uniform SPR effect/sensitivity all around the optical fiber sensor resulting in better performance (less variability) of the bioassay executed with these sensors. An even gold coating also affects the ability to apply a chemical layer by self-assembly more homogeneously also resulting in a better performance (less variability) of the bioassay.

In an embodiment in accordance with the present invention, the film has a thickness in a range from about 1 nm to 100 nm; preferably from about 10 nm to 70 nm. In another embodiment the thickness of the film at the surface of the substrate is higher on the part of the substrate that is located close to the sputter device. In an even more preferred embodiment, the ratio of the thickness of the film on the substrate close to the sputter device compared to the thickness of the film in the center or the sides of the substrate is preferably in a range between 1 to 50; even more preferably between 1 to 15.

In a further embodiment according to the present invention, a surface plasmon resonance of said film has a resonance dip which is symmetric. This allows to generate a more stable optical signal, and it behaves more robust and comparable as a sensor within different probes. Furthermore, the homogenous coating allows a more consistent application and behaviour of the chemical layer that is applied on top of the homogeneous coating.

In accordance with a further embodiment of the present invention, the coated substrate is obtained by using the sputter deposition system as described by the present invention Further, in an embodiment according to the present invention, said film is homogeneously deposited on the substrate, preferably with less than 1% of difference in the thickness of the coating.

In yet a further aspect, the present invention relates to the use of a sputter deposition system as described in herein or a method as herein, in a coating process of one or more substrates.

EXPERIMENTAL PART

In the present experimental part, coated substrates, also referred to here below as sensor probes, have been obtained by means of the method and the sputter deposition system according to the present invention, analyzed and compared to coated substrates obtained via methods and sputter deposition systems in the state of the art.

Materials and Methods

Manufacturing of the coated substrates was achieved by cleaving an optical fiber into short pieces and remove part of the jacket and cladding exposing the core of the optical fiber. After cleaning of the core of the optical fiber the sensor probes were placed in the sputter holder in a magnetron sputter coater with the exposed core pointing upwards directly underneath the gold target. The sputter chamber is pumped to a low vacuum and a magnetron induced plasma is generated which creates a gradient of gold atoms from the target throughout the vacuum chamber. The process is stopped when sufficient gold is applied to a quartz crystal monitor within the vacuum chamber. The sensor probes are removed from the vacuum chamber and out of the sputter holder to be fixed on a connector piece which allows connecting the sensor probe to the optical sensor instrument.

Analysis of the Coated Substrates

The gold coated probes are mounted on the fiber optic SPR instrument consisting of a white light source and a spectrometer coupled to a bifurcated optical fiber. The white light is led through the bifurcated optical fiber into the sensor probe where it interacts with the gold layer to create the SPR effect. At the end face of the sensor probe the SPR modified light is reflected back to the bifurcated fiber guiding the light to the spectrometer which measures the intensities of the light over a wavelength range (500-750 nm) every 50 ms.

First a reference measurement is taken in air where the SPR effect is below 500 nm. This results in a spectrum with particular light intensities at different wavelengths. The signal is transformed according to (live signal−dark noise)/(reference−dark noise) resulting in a straight line with value of 1 over all wavelengths. When the sensor probe is inserted in water the SPR effect becomes apparent in the monitored wavelength range. This can be seen as a dip in the transformed signal which shape and position is dependent on the measured analyte as well as on the gold thickness applied to the sensor probe.

Results

Figure 7:
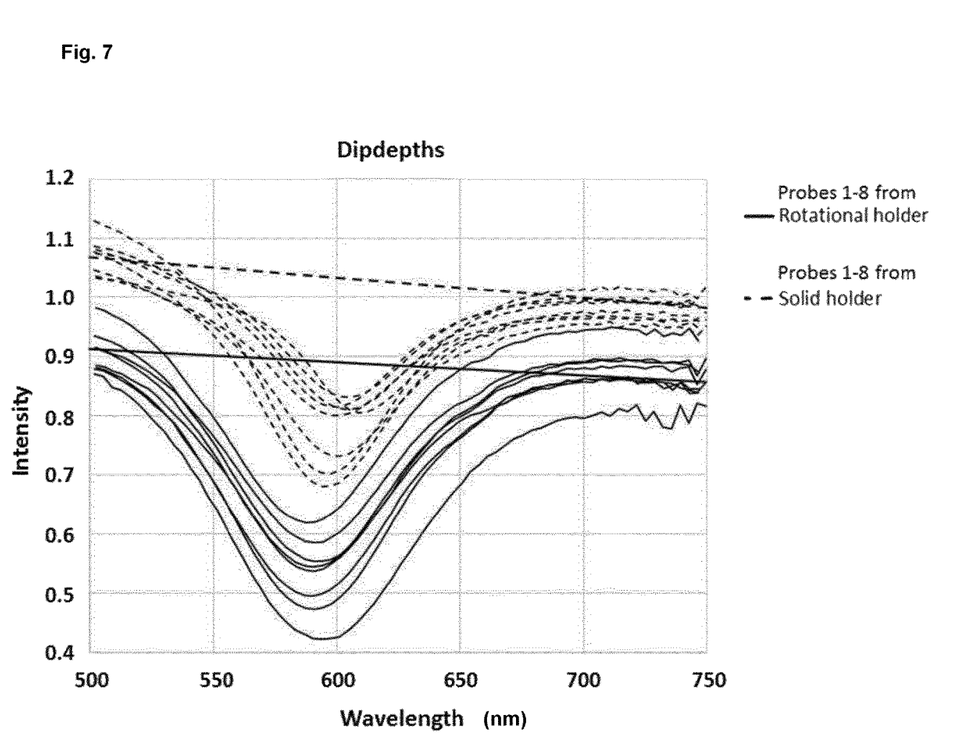

In particular, FIG. 7 illustrates SPR data comparison for two batches of probes, a first batch (batch 1) of probes, not in accordance with the present invention, and obtained by means of a method and a systems in the state of the art, wherein the probes are coated while their position is fixed, i.e. a solid (static) probe holder is used (see dashed lines), and a second batch (batch 2) comprising probes according to the present invention, obtained by means of a sputter deposition system and method according to the present invention (see solid lines, rotational probe holder). Probes according to the present invention (in batch 2) are characterized by a more homogeneous coverage of a sputtered material (in this case gold), which has influence on the SPR data obtained. In particular, FIG. 7 illustrates SPR dips for each probe batch tested. In FIG. 7, the SPR dips intensities are shown in percentage. As previously mentioned, the original percentage is obtained comparing reflection in air to reflection in water. The minimal reflection within the SPR dip is calculated as a single wavelength to reflect the SPR signal. With either thicker gold or a surrounding medium at higher refractive index the calculated wavelength changes to longer wavelengths. The wavelength calculated in water is highly correlated to the thickness of the gold. Table 1 shows that the standard deviation obtained with the new method is much smaller indicating a much more similar thickness of gold on all the sensor probes within a batch. The SPR dip depths were obtained for wavelength range 500 nm to 750 nm and in water. Each batch of probes comprises 16 probes. The probes in each batch are coated with gold. Results of these measurements are summarized in Table 1 here below:

TABLE 1

| Parameter | Solid probe holder - batch 1 | | | Rotational probe holder (present invention) - batch 2 | | |
|---|---|---|---|---|---|---|
| | average | stdev | Cv % | average | stdev | Cv % |
| Water wavelength | 602.04 | 4.031 | 0.67% | 590.36 | 1.56 | 0.26% |
| Drift stable | 0.0015 | 0.069 | 4546.35% | −0.021 | 0.043 | −204.36% |
| Intensity difference $I_d$ (500-750) | 0.096 | 0.017 | 17.78% | 0.050 | 0.012 | 23.22% |
| Dip depth | 20.04 | 4.66 | 23.26% | 36.6 | 3.66 | 10.00% |

Table 1 illustrates average values of water wavelength, drift stable, intensity difference Id in the range 500-750 nm, and the dip depth for each batch/method. In table 1 above, Cv % represents the coefficient of variance expressed in % (stdev/average).

The probes obtained in accordance with the present invention are provided with a homogeneous coating that has a direct effect on the SPR data obtainable therefrom. By comparing the results obtained for the two different batches, it is evident that the batch 2 (probes of present invention) comprises probes having a more stable (smaller standard deviation) intensity difference, in the range 500 nm-750 nm, compared to probes in batch 1 (state of the art). The intensity difference Id has been calculated by subtracting the intensity values for each probe at a wavelength of 750 nm with the intensity values at a wavelength of 500 nm. Average values of intensity difference Id for each batch are shown in Table 1. In FIG. 7, two straight lines, one dashed and one solid, represent this average intensity difference Id for batch 1 (dashed), and batch 2 (solid). Further, the smaller average intensity difference Id for batch 2 also illustrates the advantage of probes of the present invention of providing lower light loss at longer wavelengths. Further, based on FIG. 7, probes in batch 2 provide for deeper dip depths, and also show the more homogeneous coating on all sides of the probes. And more homogeneous gold thickness in between probes in a batch, as seen in the standard deviation of the water wavelength.

By means of the method according to the present invention, it has also been surprisingly found that a specific marking can be obtained on the substrates, which marking allows recognition of the substrates according to the present invention from substrates obtained by methods in the state of the art. The marking is characterized by a much larger zone on the sensor probes showing a gradient in gold thickness. This is visible in the change of gold color to dark black and further becomes lighter (grey) until absent. In the state of the art this gradient is less than 0.3 mm long, while in the present invention this gradient extends to more then 0.5 mm. The gradient is caused by the self rotating sensor probes being partly exposed at the edge of the sputter holder and the friction to the sputter holder.

LEGEND 1 substrate or substrates
2 rotatable substrate holder
3 outer ring
4 inner ring
stop system
6 slot or slots
7 recess to receive a rubber layer
8 engaging protrusion

The invention claimed is:

1. A sputter deposition system for depositing at least one film on one or more substrates, the sputter deposition system comprising:
   a sputter chamber equipped with a rotatable substrate holder for holding the one or more substrates,
   wherein:
   the rotatable substrate holder is configured to hold the one or more substrates and to allow rotation of the one or more substrates around their own axis and around a rotation axis of the rotatable substrate holder;
   the rotatable substrate holder comprises a bearing assembly comprising an outer ring and an inner ring; and
   the bearing assembly is configured so that the one or more substrates are bearing or bearings of the bearing assembly.

2. The sputter deposition system of claim 1, wherein the rotatable substrate holder further comprises a rubber layer present between the outer ring and the inner ring at a location configured to contact the one or more substrates, thereby providing friction during rotation of the one or more substrates.

3. The sputter deposition system of claim 1, wherein the rotatable substrate holder is configured to receive the one or more substrates under an angle from 0.1° to 15°.

4. The sputter deposition system of claim 1, wherein the rotatable substrate holder is configured to receive the one or more substrates under an angle from 0.5° to 5°.

5. The sputter deposition system of claim 1, wherein the sputter chamber is a high vacuum chamber.

6. The sputter deposition system of claim 1, wherein the one or more substrates are one or more optical fibers.

7. The sputter deposition system of claim 1, wherein the one or more substrates are one or more optical sensors.

8. The sputter deposition system of claim 1, wherein the one or more substrates are cylindrical substrates.

9. A method for homogeneously depositing at least one film on one or more substrates, using the sputter deposition system according to claim 1, the method comprising:

positioning at least a part of the one or more substrates at a position between the inner ring and the outer ring of the bearing assembly;

providing rotation of either the inner ring, relative to the outer ring, or of the outer ring, relative to the inner ring, thereby allowing rotation of the one or more substrates around their own axis and around a rotation axis of the rotatable substrate holder; and depositing a film of particles on the one or more substrates during rotation of the one or more substrates.

10. The method of claim 9, wherein the one or more substrates are positioned in the rotatable substrate holder under an angle from 0.1° to 15°.

11. The method of claim 9, wherein the one or more substrates are positioned in the rotatable substrate holder under an angle from 0.5° to 5°.

12. The method of claim 9, wherein the one or more substrates are one or more optical fibers.

13. The method of claim 9, wherein the one or more substrates are one or more optical sensors.

14. The method of claim 9, wherein the one or more substrates are cylindrical substrates.

\* \* \* \* \*